(12) United States Patent
Zhang et al.

(10) Patent No.: US 12,327,960 B2
(45) Date of Patent: Jun. 10, 2025

(54) POWER SUPPLY SOCKET WITH VIBRATION TOUCH KEYS

(71) Applicant: Shenzhen Buydeem Technology Co., Shenzhen (CN)

(72) Inventors: George Mohan Zhang, Shenzhen (CN); Pengrui Zhong, Shenzhen (CN); Shubin Zou, Shenzhen (CN); Haixin Wu, Shenzhen (CN); Jun Wang, Shenzhen (CN); Chenfa Kang, Shenzhen (CN)

(73) Assignee: Shenzhen Buydeem Technology Co., Shenzhen (CN)

( * ) Notice: Subject to any disclaimer, the term of this patent is extended or adjusted under 35 U.S.C. 154(b) by 902 days.

(21) Appl. No.: 17/507,830

(22) Filed: Oct. 22, 2021

(65) Prior Publication Data

US 2022/0231468 A1 Jul. 21, 2022

(30) Foreign Application Priority Data

Jan. 18, 2021 (CN) .......................... 202110063978.2

(51) Int. Cl.
*H01R 39/00* (2006.01)
*A47J 27/21* (2006.01)
(Continued)

(52) U.S. Cl.
CPC .......... *H01R 13/70* (2013.01); *A47J 27/2105* (2013.01); *G06F 3/016* (2013.01); *G06F 3/041* (2013.01); *H01R 13/7175* (2013.01)

(58) Field of Classification Search
CPC .. H01R 13/70; H01R 13/7175; A47J 27/2105; G06F 3/041; G06F 3/016
(Continued)

(56) References Cited

U.S. PATENT DOCUMENTS

| 860,225 | A | * | 7/1907 | Merritt | ....................... | B41J 7/24 |
| | | | | | | 400/450 |
| 6,027,463 | A | * | 2/2000 | Moriyasu | ........... | A61H 23/0236 |
| | | | | | | 601/48 |

(Continued)

FOREIGN PATENT DOCUMENTS

| CN | 205411929 U | * | 8/2016 | | |
| CN | 109310224 A | * | 2/2019 | .............. | A47J 27/00 |

(Continued)

*Primary Examiner* — Abdullah A Riyami
*Assistant Examiner* — Vladimir Imas
(74) *Attorney, Agent, or Firm* — Ying-Ting Chen

(57) ABSTRACT

The present disclosure discloses a power supply socket with vibration touch keys, and relates to a touch power supply socket used on an electric kettle and a coffee pot. The power supply socket comprises a face shell, a bottom cover, a lower connector, a control circuit board and a power cord, wherein the inner side of the face shell is provided with a vibration motor installing groove, a vibration motor is installed in the vibration motor installing groove, the vibration surface of the vibration motor is in close contact with the bottom plane of the vibration motor installing groove, the vibration motor is electrically connected with the control circuit board, and the vibration motor has synchronous vibration signal feedback when a finger touches a key. The key of the present disclosure has good waterproof, dustproof, LED light guiding and vibrating effects.

11 Claims, 18 Drawing Sheets

(51) Int. Cl.
  *G06F 3/01* (2006.01)
  *G06F 3/041* (2006.01)
  *H01R 13/70* (2006.01)
  H01R 13/717 (2006.01)

(58) Field of Classification Search
  USPC .......................................................... 439/11
  See application file for complete search history.

(56) References Cited

U.S. PATENT DOCUMENTS

| | | | | |
|---|---|---|---|---|
| 8,207,832 B2* | 6/2012 | Yun | ................. | G06F 3/0488 |
| | | | | 340/407.1 |
| 8,280,448 B2* | 10/2012 | Bang | ................. | G06F 3/0488 |
| | | | | 345/173 |
| 8,761,590 B2* | 6/2014 | An | ................. | H04N 1/32144 |
| | | | | 709/217 |
| 8,935,637 B2* | 1/2015 | Kim | ................. | G06F 3/0414 |
| | | | | 715/863 |
| 9,086,755 B2* | 7/2015 | Cho | ................. | G06F 3/04845 |
| 9,285,989 B2* | 3/2016 | Park | ................. | G06F 3/0488 |
| 9,484,631 B1* | 11/2016 | Napoles | ................. | H01Q 5/378 |
| 9,614,941 B2* | 4/2017 | Scott | ................. | G06F 1/1656 |
| 10,113,791 B2* | 10/2018 | Wenji | ................. | F25B 21/02 |
| 10,403,280 B2* | 9/2019 | Lee | ................. | H05B 47/12 |
| 10,468,769 B2* | 11/2019 | Ahn | ................. | H01Q 5/25 |
| 10,560,409 B2* | 2/2020 | Ryu | ................. | G06F 3/1423 |
| 10,754,439 B2* | 8/2020 | Kotta | ................. | H03K 17/972 |
| 10,901,531 B2* | 1/2021 | Lee | ................. | G06F 3/04815 |
| 10,963,211 B2* | 3/2021 | Park | ................. | G06F 3/1454 |
| 11,199,853 B1* | 12/2021 | Afrouzi | ................. | B25J 13/006 |
| 2006/0132446 A1* | 6/2006 | Soh | ................. | G06F 3/0202 |
| | | | | 345/168 |
| 2007/0142077 A1* | 6/2007 | Huang | ................. | A63F 13/323 |
| | | | | 455/550.1 |
| 2013/0233685 A1* | 9/2013 | Zhang | ................. | H01H 13/85 |
| | | | | 200/344 |

FOREIGN PATENT DOCUMENTS

| | | | | |
|---|---|---|---|---|
| CN | 211063908 U | * | 7/2020 | |
| CN | 215133291 U | * | 12/2021 | |
| CN | 215583777 U | * | 1/2022 | |
| CN | 109039318 B | * | 1/2023 | ............. G05D 19/02 |
| WO | WO-2009032598 A1 | * | 3/2009 | ............. G07F 17/32 |

* cited by examiner

POWER SUPPLY SOCKET WITH VIBRATION TOUCH KEYS

TECHNICAL FIELD

The present disclosure relates to a power cord holder, in particular to a dustproof and waterproof touch power supply socket used on an electric kettle and a coffee pot.

BACKGROUND

In small household appliances, in electric kettles, coffee pots, health pots, steamers and other electrical products, the power socket is widely used. Generally, the power socket adopts mechanical keys and fewer touch bases, and the overall function configuration is too single without too many innovative changes. First, the mechanical key structure comprises a face shell and a base bottom, the face shell is installed on the line base bottom. A circuit board and a coupler (a lower connector) for connecting the upper kettle are installed between the face shell and the base bottom. The face shell is provided with a key which is provided with a switch touch boss. An elastic silica gel sheet is provided between the key and the touch switch of the circuit board, and a pressure plate is provided around the elastic silica gel sheet to press and seal or make a drainage hole. In this structure, there is a gap between the key and the face shell. The gap is easy to be blocked and stuck by foreign matters, and water is easy to accumulate between the key and the elastic silica gel sheet. The elastic silica gel sheet will accelerate aging and lose its elasticity at the stressed position which is pressed for a long time. In severe cases, it will also be cracked and damaged and cannot be safely sealed, which may cause the risk of electric leakage or electric shock, thus shortening the service life of the power supply socket to a certain extent. Second, generally, the structure key guide sign of the conventional in-use touch power supply socket adopts the film pasting technology. This technology has a small film pasting sheet, poor position and easy edge leakage. There are too many dust spots, and the edges are easy to be embossed and warped. At the same time, the light transmission effect is uneven and easily light escaping, which cannot meet the requirements of higher-grade products. Alternatively, a small number of touch-type power socket surface shells will adopt IMD in-mold injection molding technology, which can provide products with better surface wear-resistant and chemical-resistant characteristics and diversified styles, and can create technical features such as metal plating or special styles of natural materials according to customer requirements. However, IMD technology needs smooth appearance to meet the manufacturing process, which has great restrictions on structural modeling design. The mold cost and unit price cost of this technology are very high. At present, this technology cannot meet the popularization and application of multi-modeling power sockets.

SUMMARY

The technical problem to be solved by the present disclosure is to provide a power supply socket with vibration touch keys for electric kettles, coffee pots, health pots, steamers and other products with good waterproof, dustproof and LED light guiding effects.

In order to solve the above technical problems, the present disclosure adopts the following technical scheme. A power supply socket with vibration touch keys comprises a face shell, a bottom cover, a lower connector, a control circuit board and a power cord, wherein the inner side of the face shell is provided with a vibration motor installing groove, a vibration motor is installed in the vibration motor installing groove, the vibration surface of the vibration motor is in close contact with the bottom plane of the vibration motor installing groove, the vibration motor is electrically connected with the control circuit board, and the vibration motor has synchronous vibration signal feedback when a finger touches a key.

Further, the face shell is provided with a touch key installing hole, the touch key installing hole is provided with a touch key transparent aperture, a first sealing ring is provided between the touch key transparent aperture and the face shell, a transparent aperture fixing base for fixing the touch key transparent aperture is provided below the touch key transparent aperture, the touch key transparent aperture is located above the transparent aperture fixing base, a fixing base through hole is provided at the middle position of the transparent aperture fixing base corresponding to finger touch, and a touch spring on the control circuit board and an indicator lamp are installed in the middle of the fixing base through hole;

the face shell is provided with a lamp strip installing hole, a lamp strip progress bar is installed at the lamp strip installing hole, the lamp strip progress bar consists of a plurality of lamp strip posts, a second sealing ring is provided between the lamp strip progress bar and the face shell, a lamp strip post fixing base for fixing the lamp strip post is provided below the lamp strip post, a lamp strip post through hole is provided in the middle of the lamp strip post fixing base corresponding to the lamp strip post, and a lamp strip indicator lamp is installed in the lamp strip post through hole.

Further, a function knob A is provided, the function knob A comprises a knob, a knob transparent aperture, a knob decorative sheet, a knob spring and a sliding post, the face shell is provided with a function knob installing hole, a function knob gear groove and a function knob limiting block; the center of the function knob A is provided with a bolt connected with a potentiometer, every time the function knob A rotates to switch an angle, the bolt of the potentiometer drives the potentiometer to switch a function angle, and the sliding post stretches and bounces into the corresponding gear groove.

Further, the vibration surface of the vibration motor is provided with an adhesive layer which closely adheres to the bottom plane of the vibration motor installing groove; the back surface of the vibration motor is pressed by a motor fixing base, and an elastic buffer material layer is provided between the back surface of the vibration motor and the motor fixing base.

Further, the touch key transparent aperture comprises an aperture ring, a first polygonal positioning hole, a first positioning rib gap, a limiting bump, a sealing convex rib, the aperture ring is provided with a touch decorative sheet, the touch decorative sheet is provided with a touch decorative sheet positioning post, a first positioning rib and an abutting surface, the touch decorative sheet positioning post abuts against a first polygonal positioning hole of a transparent aperture, and the first positioning rib of the touch decorative sheet is matched with the first positioning rib gap of the transparent aperture; the face shell is provided with a limiting notch, a lamp strip limiting notch, a key silica gel sealing groove and a lamp strip silica gel sealing groove, and the limiting bump of the touch key transparent aperture is matched with the limiting notch of the face shell.

Further, the lamp strip progress bar comprises a lamp strip post, a limiting rib, and a connecting arm, and the limiting rib is matched with the lamp strip limiting notch on the face shell.

Further, the face shell is provided with a key transparent aperture surrounding bone and a light bar surrounding bone, the transparent aperture fixing base is provided with a first anti-light escaping surrounding bone, the lamp strip post fixing base is provided with a second anti-light escaping surrounding bone, the touch key transparent aperture is accommodated in the first anti-light escaping surrounding bone, the lamp strip of a lamp strip abutment table is accommodated in the second anti-light escaping surrounding bone, the first anti-light escaping surrounding bone on the transparent aperture fixing base abuts against the key transparent aperture surrounding bone, the second anti-light escaping surrounding bone abuts against the lamp strip surrounding bone, the transparent aperture fixing base is provided with a lamp ring avoiding notch, the lamp strip post fixing base is provided with a lamp strip avoiding notch, and a lamp ring limiting lug corresponding to the lamp strip avoiding notch and a lamp strip limiting rib corresponding to the lamp strip avoiding notch provide assembly retreating.

Further, the knob transparent aperture comprises a centering shaft, a potentiometer knob bolt, an elastic buckle, a male buckle, a limiting convex rib and an abutting surface convex rib, the knob is provided with a knob installing hole, a recess and a female buckle, the knob transparent aperture limiting convex rib is matched with the recess, and the male buckle is buckled with the female buckle.

Further, the touch key transparent aperture sealing ring, the connecting arm and the connecting arm of the lamp strip progress strip sealing ring are connected integrally.

Further, the function knob A is provided with an annular convex rib, the abutting mating surface between the knob and the knob transparent aperture is provided with a waterproof sealing rib on the knob transparent aperture.

Further, the function knob A further comprises a knob transparent aperture bracket and a sealing silica gel ring, the sliding post is provided between the knob transparent aperture and the knob transparent aperture bracket and is perpendicular to each other, the knob transparent aperture bracket is provided with a gear groove, a limiting lug and a limiting lug, a drainage pipe and an annular surrounding bone, a sealing silica gel ring is provided between the knob transparent aperture bracket and the face shell, the drainage pipe is directly connected to the bottom cover water leakage port, and the annular surrounding bone is inserted into the surrounding bone and overlapped with each other.

Further, the knob decorative sheet is a depressible knob key, the potentiometer bolt on the knob transparent aperture is provided with a through hole, the knob key is provided with a key pin and a buckle position, the key pin is placed on the key switch through the through hole, the elastic silica gel is provided between the knob key and the knob transparent aperture, and the elastic silica gel plays a role in sealing and resetting the key press.

The key of the present disclosure has good waterproof, dustproof, LED light guiding, vibrating effects.

DETAILED DESCRIPTION

The present disclosure will be described in further detail with reference to the accompanying drawings.

Figure 1:
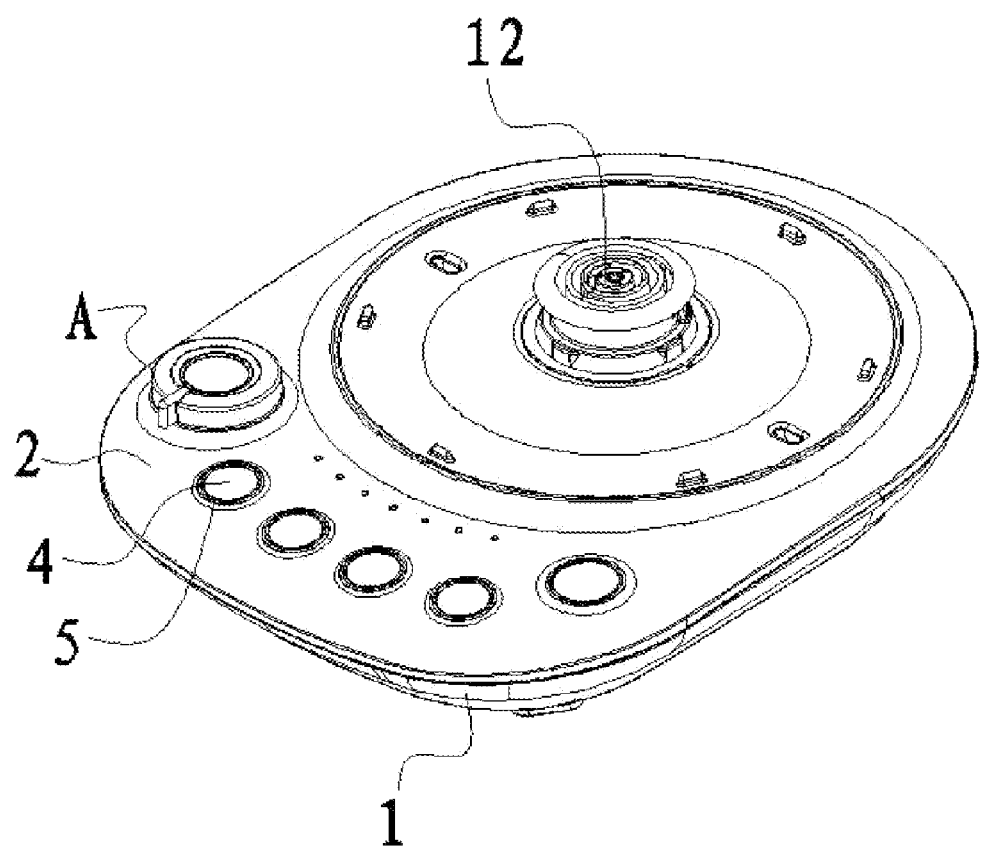
FIG. 1 is a structural schematic diagram of one of the preferred embodiments of the present disclosure.
Figure 2:
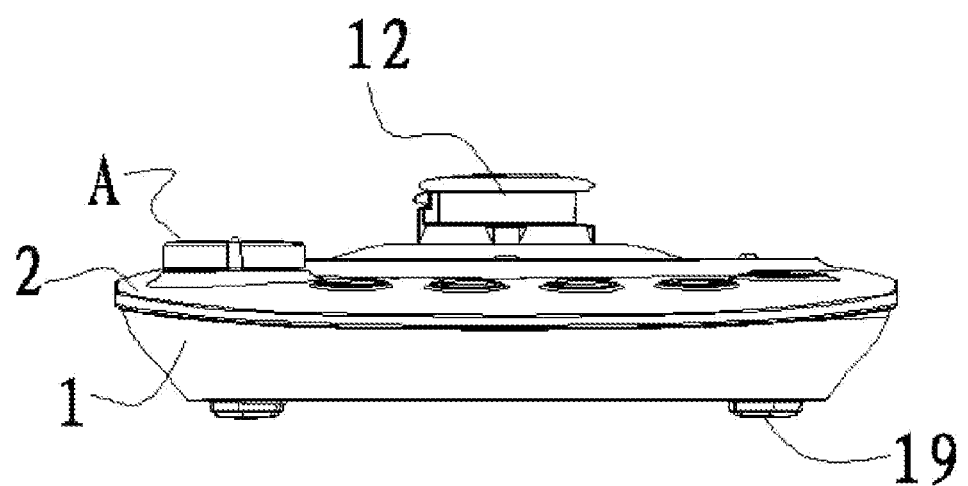
FIG. 2 is a schematic side view of FIG. 1.
Figure 3:
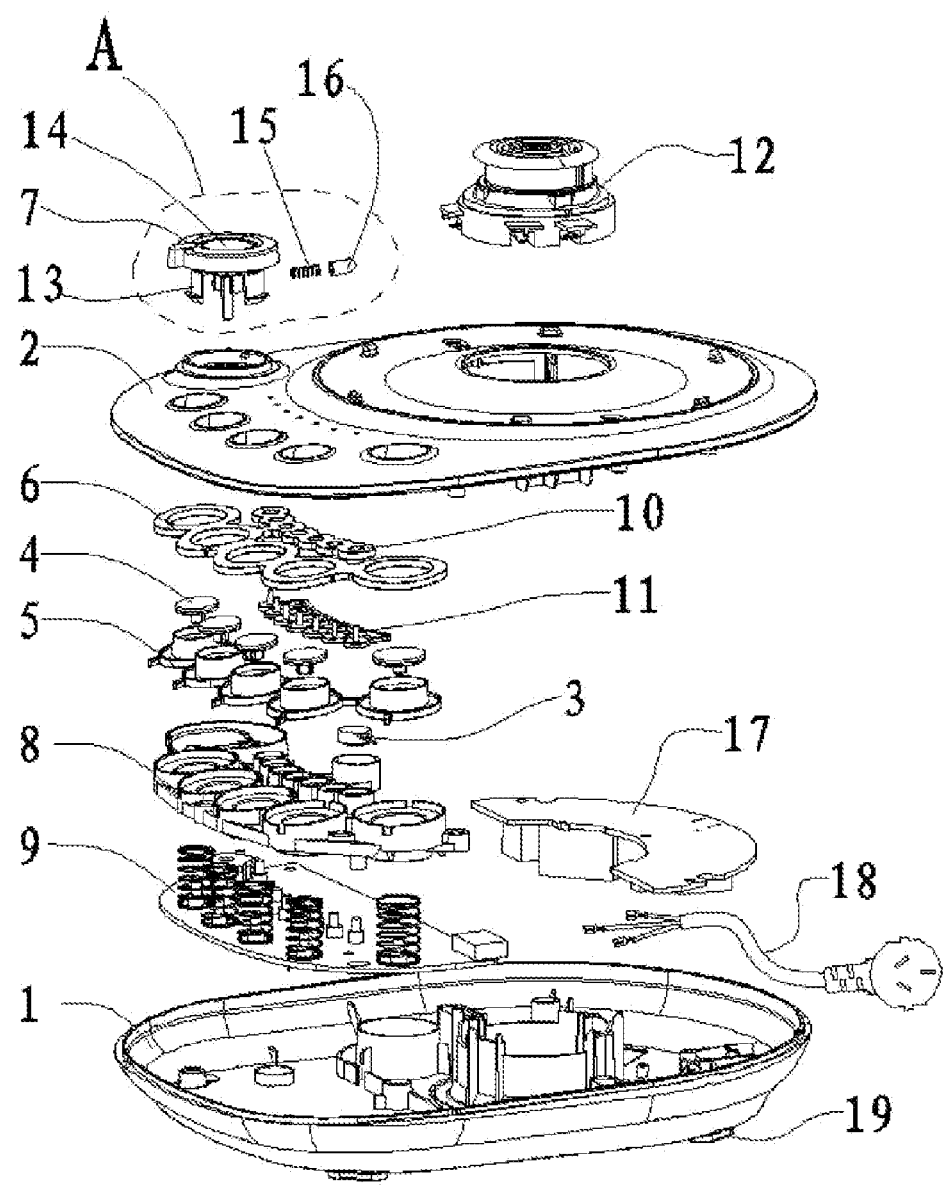
FIG. 3 is a separation schematic diagram of one of the preferred embodiments of the present disclosure.
Figure 4:
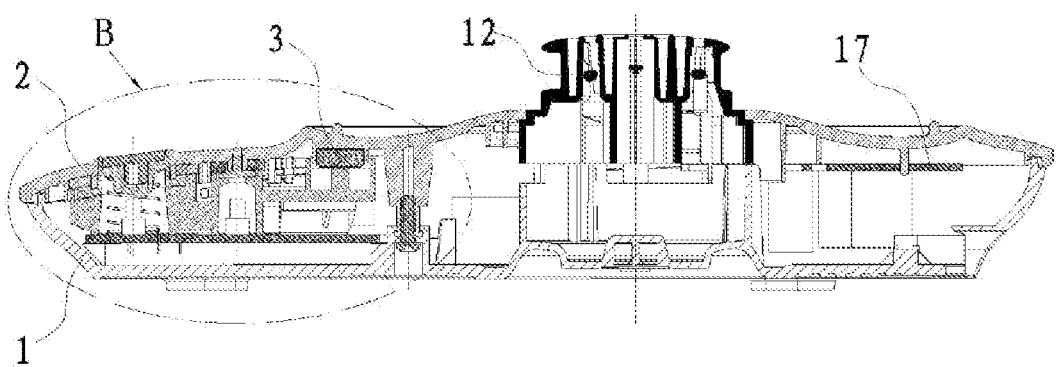
FIG. 4 is a schematic structural sectional view of one of the preferred embodiments of the present disclosure.
Figure 5:
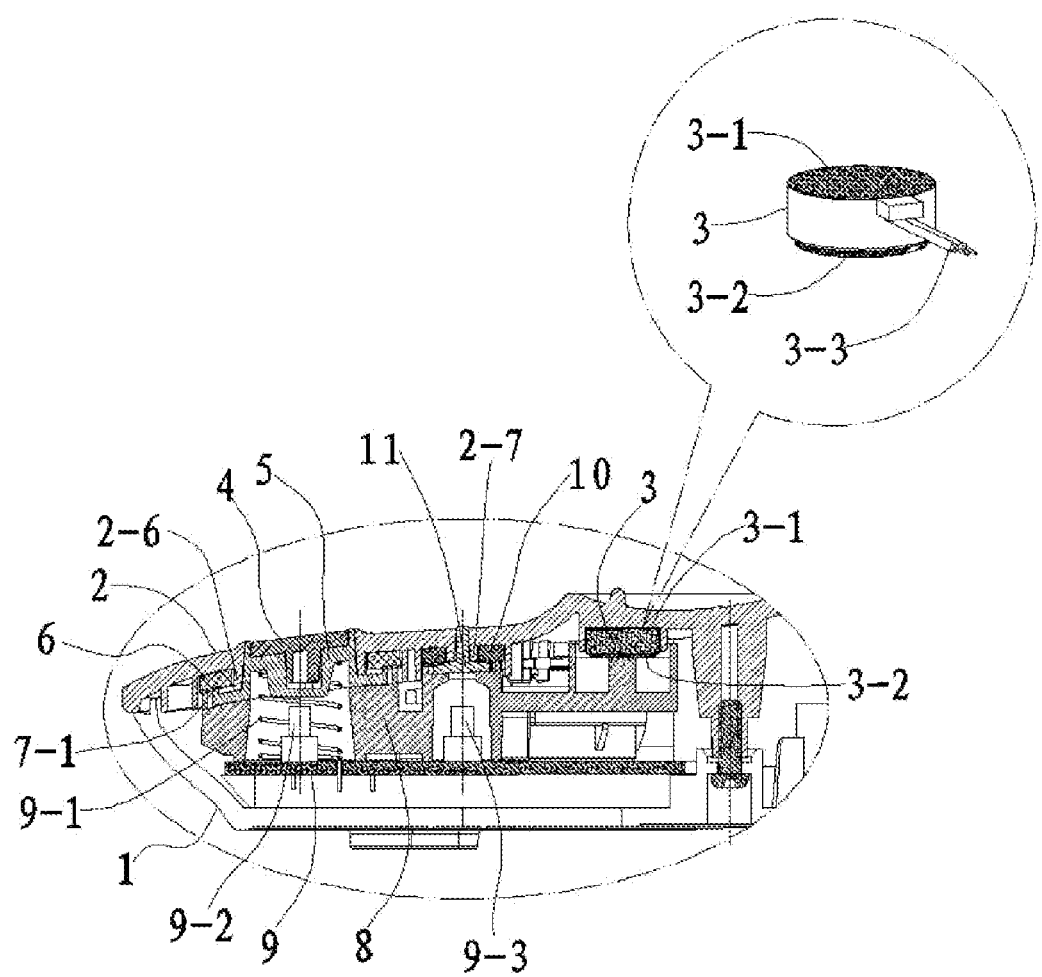
FIG. 5 is a partially enlarged schematic diagram at B in FIG. 4.
Figure 6:
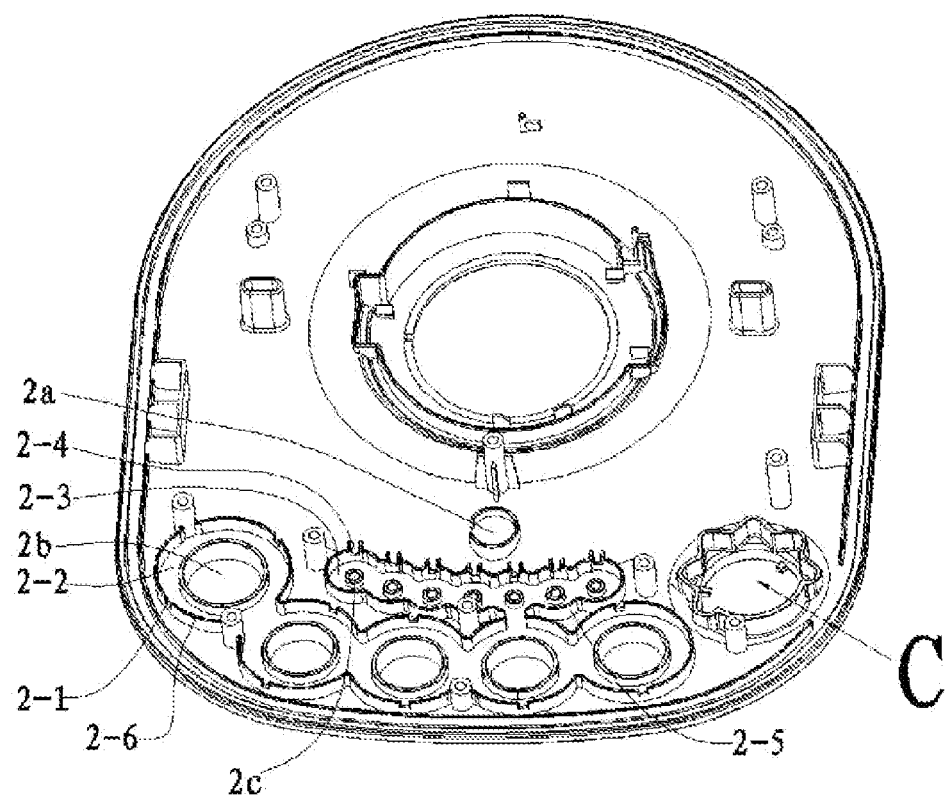
FIG. 6 is an schematic structural analysis diagram of the bottom structure of a face shell according to one of the preferred embodiments of the present disclosure.

As shown in FIG. 1 to FIG. 3, a power supply socket with vibration touch keys comprises a face shell 2, a bottom cover 1, a vibration motor 3, a lower connector 12, a control circuit board 9, a power cord 18, a foot pad 19, a touch key transparent aperture 5, a lamp strip progress bar 11 and a knob A. As shown in FIG. 4, FIG. 5 and FIG. 6, the inner side of the face shell 2 is provided with a vibration motor installing groove 2*a*. A vibration motor 3 is installed in the vibration motor installing groove 2*a*. The vibration surface of the vibration motor 3 is in close contact with the bottom plane of the vibration motor installing groove 2*a*. In order to ensure the reliability of this contact, the vibration surface of the vibration motor 3 is provided with an adhesive layer 3-1 which is tightly bonded with the bottom plane of the installing groove 2*a*. The back surface of the vibration motor is pressed by a motor fixing base 801. An elastic buffer material layer 3-2 is provided between the vibration motor 3 and the motor fixing base 801 to protect the vibration motor 3 from crushing and reduce noise. The lead wire 3-3 of the vibration motor 3 is electrically connected with the control circuit board 9. When the finger touches a key, the vibration motor will have synchronous tactile signal feedback, which brings different touch experiences to the user. The face shell 2 is provided with a touch key installing hole 2b. A touch key transparent aperture 5 is installed on the touch key installing hole 2b. An inner ring of the touch key transparent aperture 5 is provided with a touch decorative sheet 4. A first sealing ring 6 is provided between the touch key transparent aperture 5 and the face shell 2. A transparent aperture fixing base 802 is provided below the touch key transparent aperture 5. The touch key transparent aperture 5 and the touch decorative sheet 4 are located above the transparent aperture fixing base 802. The fixing base through hole 8-2 is provided at the middle position of the transparent aperture fixing base 802 corresponding to finger touch, and a touch spring 9-1 on the control circuit board and an indicator lamp 9-2 are installed in the middle of the fixing base through hole 8-2. The touch end of the touch spring 9-1 abuts against with the inner surface of the touch key transparent aperture 5. The abutting surface 4-3 of the touch key transparent aperture 5 and the touch decorative sheet 4 is right at the position of the touch spring 9-1, and no gap is reserved in the design, which is beneficial to touch sensitivity debugging. The face shell 2 is provided with a lamp strip installing hole 2c. A lamp strip progress bar 11 is installed at the lamp strip installing hole 2c. The lamp strip progress bar 11 consists of a plurality of lamp strip posts 11-1. The bottom end of the lamp strip posts 11-1 is provided with an abutting table 11-4. A second sealing ring 10 is provided between the abutting table 11-4 and the face shell 2. A lamp strip post fixing base 803 for fixing the lamp strip post is provided below the lamp strip post 11-1. A lamp strip post through hole 8-3 is provided in the middle of the lamp strip post fixing base 803 corresponding to the lamp strip post 11-1, and a lamp strip indicator lamp 9-3 of the control circuit board is installed in the middle of the lamp strip post through hole 8-3. The function of the lamp strip progress bar 11 is to make cooking say goodbye to blind guessing and make the cooking progress clear at a glance.

Figure 9:
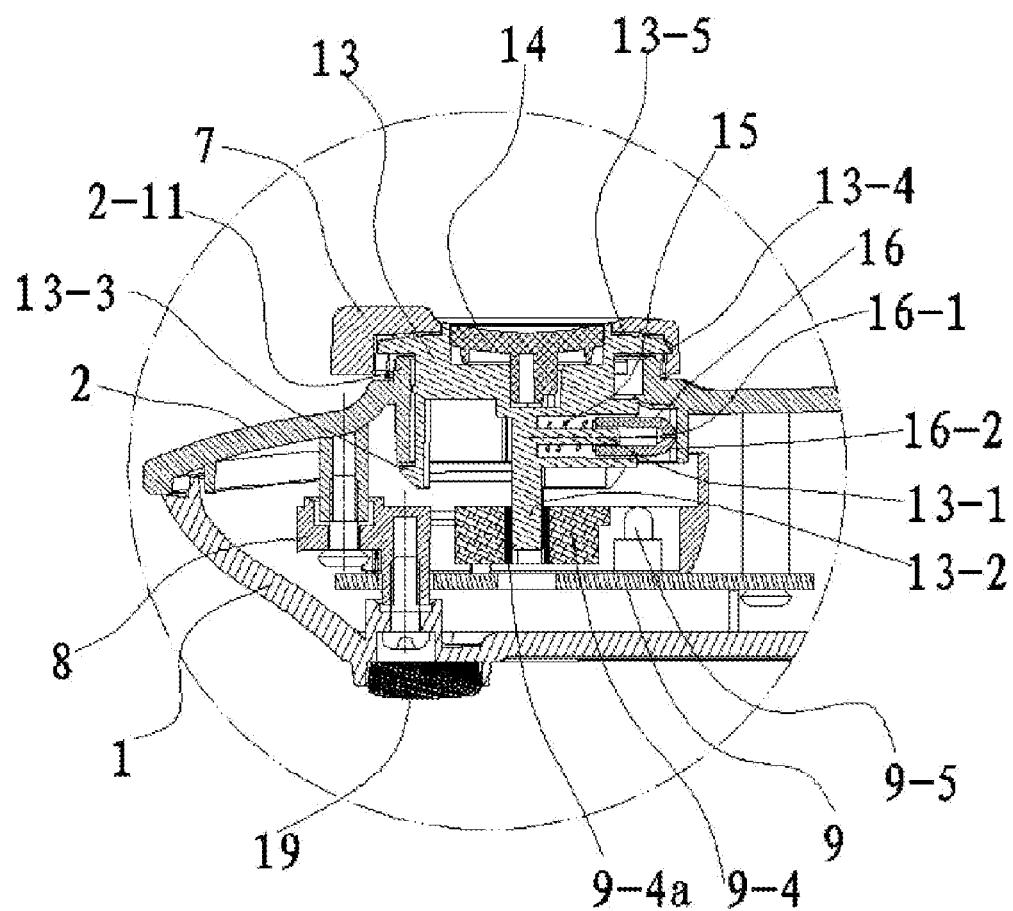
FIG. 9 is a schematic sectional view of a first embodiment of the function knob A according to one of the preferred embodiments of the present disclosure.
Figure 10:
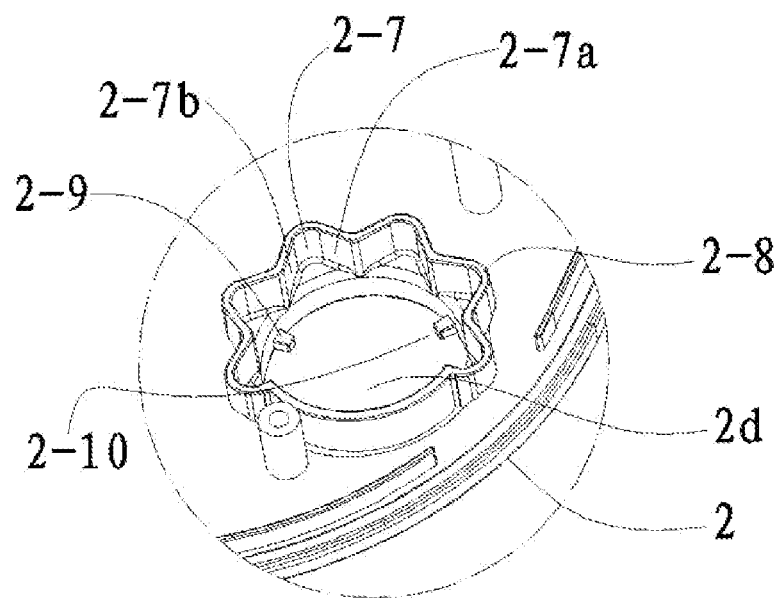
FIG. 10 is a partially enlarged schematic diagram at C in FIG. 6.
Figure 11:
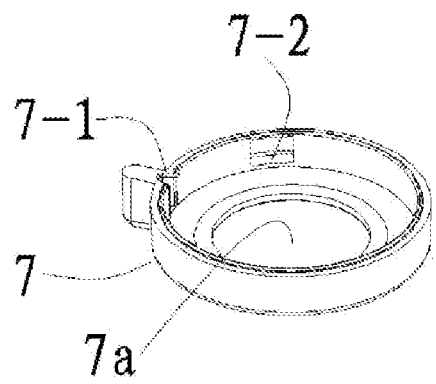
FIG. 11 is a schematic structural analysis diagram of a knob in FIG. 9.
Figure 12:
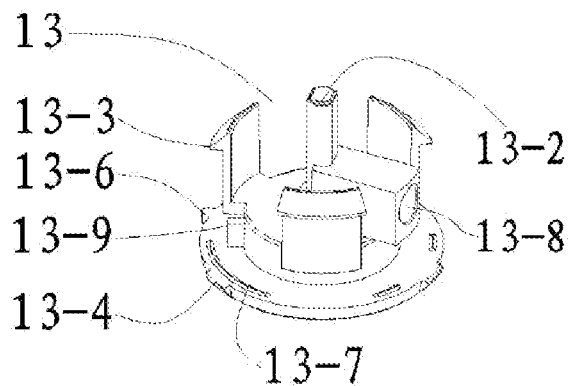
FIG. 12 is a schematic structural analysis diagram of a knob transparent aperture in FIG. 9.
Figure 13:
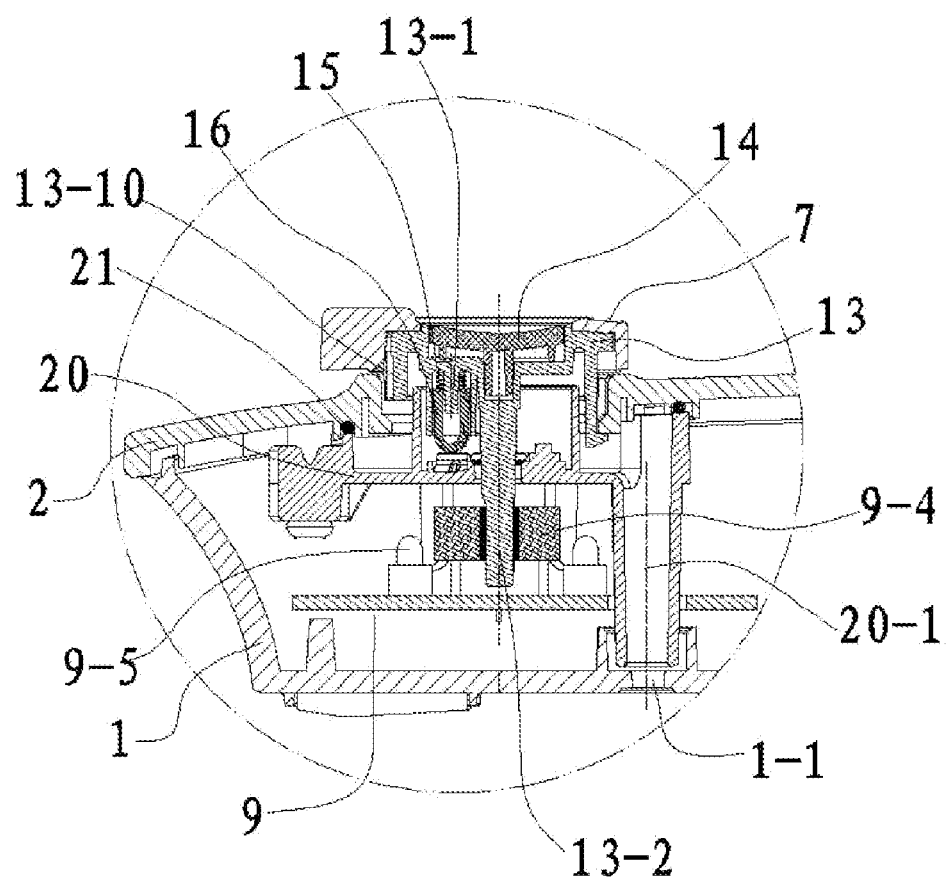
FIG. 13 is a schematic sectional view of a second embodiment of the function knob A.

As shown in FIG. 1, FIG. 2, FIG. 9, FIG. 10, FIG. 11 and FIG. 12, according to the requirements of product function configuration, a multi-function knob A can be flexibly configured on the touch key-type power cord base. The function knob A mainly consists of a knob 7, a knob transparent aperture 13, a knob decorative sheet 14, a knob spring 15 and a sliding post 16. The face shell 2 is provided with a second installing hole 2d for installing the knob 7. A plurality of gear grooves 2-7, a knob abutting surface 2-8, a limiting I bump 2-9 and a limiting II bump 2-10 are provided in the second installing hole 2d, as shown in FIG. 10. The knob 7 is provided with a knob installing hole 7a, a recess 7-1 and a female buckle 7-2, as shown in FIG. 11. As shown in FIGS. 9, 12 and 13, the knob transparent aperture 13 comprises a centering shaft 13-1, a potentiometer knob bolt 13-2, an elastic buckle 13-3, a male buckle 13-4, a sealing convex rib 13-5, a limiting convex rib 13-6, an abutting surface convex rib 13-7, an accommodating hole 13-8 and a rotation limiting rib 13-9. As shown in FIG. 9 and FIG. 13, the knob transparent aperture 13 is fixed on the knob installing hole 7a. The limiting convex rib 13-6 of the knob transparent aperture coincides with the recess 7-1 of the knob 7, and the male buckle 13-4 of the knob transparent aperture 13 is buckled with the female buckle 7-2 of the knob 7. One end of the sliding post 16 is provided with a hollow hole 16-1, and the other end of the sliding post 16 is provided with a round head 16-1. One end of the sliding post 16 provided with a hollow hole 16-1 is placed in the accommodating hole 13-8 of the knob transparent aperture 13, and the hollow hole 16-1 of the sliding post 16 is sleeved on the centering shaft 13-1 of the knob transparent aperture 13. A knob spring 15 is provided between one end of the sliding post 16 provided with a hollow hole 16-1 and the accommodating hole 13-8 of the knob transparent aperture 13. The centering shaft 13-1 of the knob transparent aperture 13 can prevent the sliding post 16 from being eccentric and crooked, which is beneficial to ensuring the linear expansion and contraction of the sliding post 16. The function knob A is buckled and connected with the knob abutting surface 2-8 of the face shell 2 by the elastic buckle 13-3 on the knob transparent aperture 13.

As shown in FIG. 9, the potentiometer knob bolt 13-2 of the knob transparent aperture 13 is inserted into the gear rotary bushing 9-4a of the potentiometer 9-4 on the control circuit board 9. A plurality of indicator lamps 9-5 are provided around the potentiometer 9-4 of the circuit board. The indicator lamps 9-5 are provided between the control circuit board 9 and the knob transparent aperture 13. A knob decorative sheet 14 is provided in the inner ring of the knob transparent aperture 13. The assembly positioning manner of the knob decorative sheet 14 and the knob transparent aperture 13 is similar to the structure of the touch key transparent aperture 5 and the touch decorative sheet 4. The structure will not be described in detail here.

As shown in FIG. 9, the center of the function knob 7 has a bolt 13-2 connected to the potentiometer. The sliding post 16 and the knob spring 15 are installed through the function knob A. Every time the function knob 7 rotates to switch an angle, the bolt 13-2 of the potentiometer 9-4 drives the potentiometer gear rotating bushing 9-4a to switch a function angle synchronously, and the sliding post 16 stretches and bounces into the corresponding gear groove 2-7, thus realizing gear function selection. As shown in FIG. 10, the gear groove 2-7 consists of a first sliding surface 2-7a and a second sliding surface 2-7b.

Figure 7:
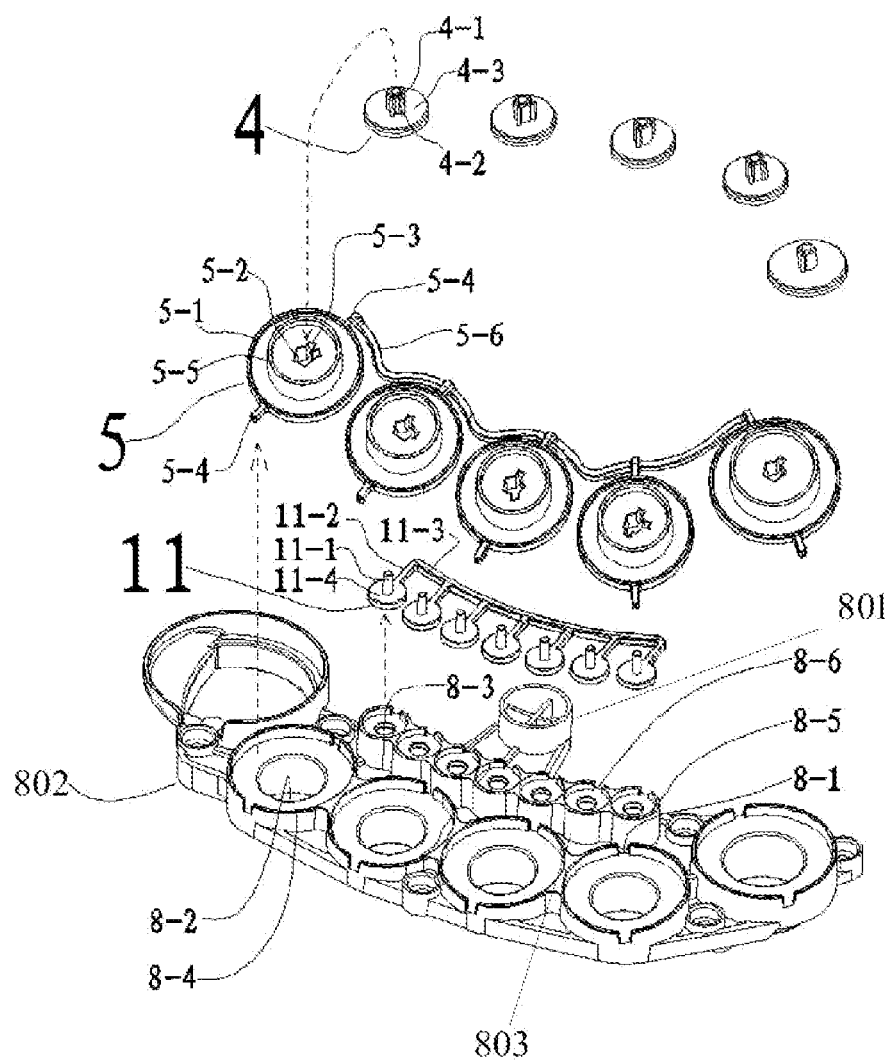
FIG. 7 is an exploded schematic diagram of the parts in FIG. 5.

In an embodiment, as shown in FIG. 7, the touch key transparent aperture 5 comprises an aperture ring 5-5, a first polygonal positioning hole 5-2, a first positioning rib gap 5-3, a limiting bump 5-4 and a sealing convex rib 5-1. A plurality of touch key transparent apertures 5 can be connected in series with a connecting arm 5-6 integrally, which is convenient for assembly, quick taking, mistake prevention and foolproof performance. Alternatively, apertures are independent according to structural requirements. A touch decorative sheet 4 is provided in the inner ring of the touch key transparent aperture 5. The touch decorative sheet 4 is provided with a positioning post 4-1, a first positioning rib 4-2 and an abutting surface 4-3. The positioning post 4-1 is provided in the middle of the abutting surface 4-3, and the first positioning rib 4-2 is arranged on the outer surface of the positioning post 4-1 along the axial direction of the positioning post 4-1. The positioning post 4-1 of the touch decorative sheet abuts against the first polygonal positioning hole 5-2 of the touch key transparent aperture. The first positioning rib 4-2 of the touch decorative sheet 4 is matched with the first positioning rib gap 5-3 of the touch key transparent aperture. The angle of the first positioning rib gap 5-3 is the same as that of the first positioning rib 4-2. According to the needs of functions, the plurality of touch key decorative sheets and the assembly positioning ribs of the transparent apertures can be set differently, so as to play the role of mistake prevention and foolproof performance in assembly. The face shell 2 is provided with a limiting notch 2-1, a lamp strip limiting notch 2-4, a key silica gel sealing groove 2-2 and a lamp strip silica gel sealing groove 2-3. A touch key transparent aperture limiting bump 5-4 is matched with the limiting notch 2-1 of the face shell 2.

In an embodiment, as shown in FIG. 6 and FIG. 7, the lamp strip progress bar 11 comprises a lamp strip post 11-1, a limiting rib 11-2 and a connecting arm 11-3. The limiting rib 11-2 is matched with a lamp strip limiting notch 2-4 on the face shell 2.

In an embodiment, the lights between all the transparent apertures of the present disclosure are designed to prevent light from escaping. As shown in FIGS. 5, 6 and 7, the face shell 2 is provided with a key transparent aperture surrounding bone 2-6 and a lamp bar surrounding bone 2-5. The transparent aperture fixing base 802 is provided with a first anti-light escaping surrounding bone 8-4, and the lamp strip post fixing base 803 is provided with a second anti-light escaping surrounding bone 8-5. The touch key transparent aperture 5 is placed in the first anti-light escaping surrounding bone 8-4. The lamp strip of the lamp strip abutting platform 11-4 is accommodated in the second anti-light escaping surrounding bone 8-5. The first anti-light escaping surrounding bone 8-4 abuts against the key transparent aperture surrounding bone 2-6. The second anti-light escaping surrounding bone 8-5 abuts against the lamp strip surrounding bone 2-5. The surrounding bone is abutted and separated layer by layer for the best anti-light escaping design. The transparent aperture fixing base 802 is provided with a lamp ring avoiding notch 8-1, and the lamp strip post fixing base 803 is provided with a lamp strip avoiding notch 8-6. A lamp ring limiting lug 5-4 corresponding to the lamp strip avoiding notch 8-6 and a lamp strip limiting rib 11 corresponding to the lamp strip avoiding notch 8-6 provide assembly retreating. The position of the avoiding notch key is not opposite to that of the key, and the position of the lamp is not opposite to that of the lamp gap, so as to prevent the light source between gaps from colliding with each other.

In an embodiment, the motor fixing base 801, the transparent aperture fixing base 802 and the lamp strip post fixing base 803 are combined to form a fixing base 8. Without departing from the spirit and scope of this embodiment, independent separation in design also falls within the protection scope of this embodiment.

Figure 8:
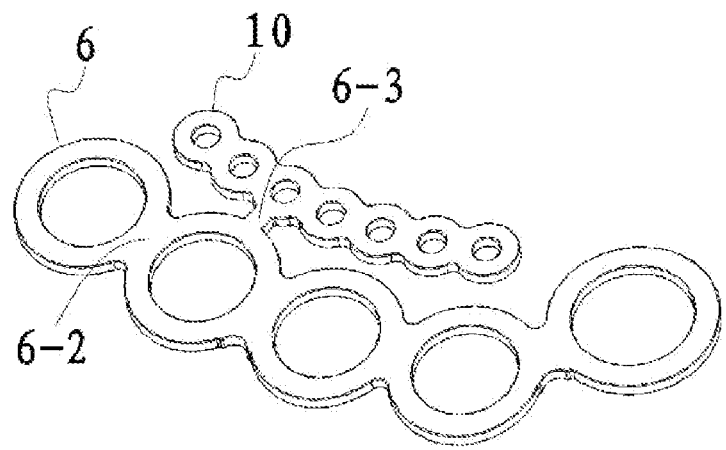
FIG. 8 is a combined schematic diagram of the parts in FIG. 5.

In this embodiment, as shown in FIG. 8, the touch key transparent aperture sealing ring 10, the connecting arm 6-2 and the connecting arm 6-3 of the lamp strip progress bar sealing ring are connected integrally, which is convenient for assembly, quick taking, mistake prevention and foolproof performance. Alternatively, the silica gel rings between keys and between lamps are separated from each other, and the lamps are separated from each other's silica gel rings. Without departing from the spirit and scope of this embodiment, independent separation in design also falls within the protection scope of this embodiment.

In an embodiment, as shown in FIG. 9, the functional knob A is provided with an annular convex rib 2-11 on the face shell 2. The annular convex rib 2-11 can prevent water droplets from flowing backwards into the knob, and can block water droplets from the knob to avoid circuit damage caused by flowing into the internal circuit board. The abutting mating surface between the knob 7 and the knob transparent aperture 13 is provided with a waterproof sealing rib 13-5 on the knob transparent aperture 13.

The installing method of the function knob A is as follows. First, the knob spring 15 and the sliding post 16 are installed into the accommodating hole 13-8 of the knob transparent aperture, and simultaneously, the sliding post 16 is pressed by fingers to be folded into the accommodating hole 13-8. Second, the sliding post 16 is aligned with the gear groove 2-7. The elastic buckle 13-3 of the knob transparent aperture can stagger the limiting lugs 2-9 and the limiting lugs 2-10 of the face shell. Finally, the elastic buckle 13-3 is buckled into the face shell installing hole 2d and installed in place. In the buckling process, when the round head 16-1 of the sliding post touches the hole wall of the installing hole 2d, the finger pressing the sliding post is released, and then the function knob A can be installed in place by using the thrust force. After assembly, the sliding post 16 is restored and bounced into the gear groove 2-7 by the elasticity of the knob spring 15.

In this embodiment, as shown in FIG. 9, the sliding post 16 of the function knob A and the potentiometer bolt 13-2 are arranged vertically, which can be regarded as a first embodiment. The embodiment of the function knob A is not limited to this, and the following second, third and fourth embodiments will be further supplemented.

Figure 14:
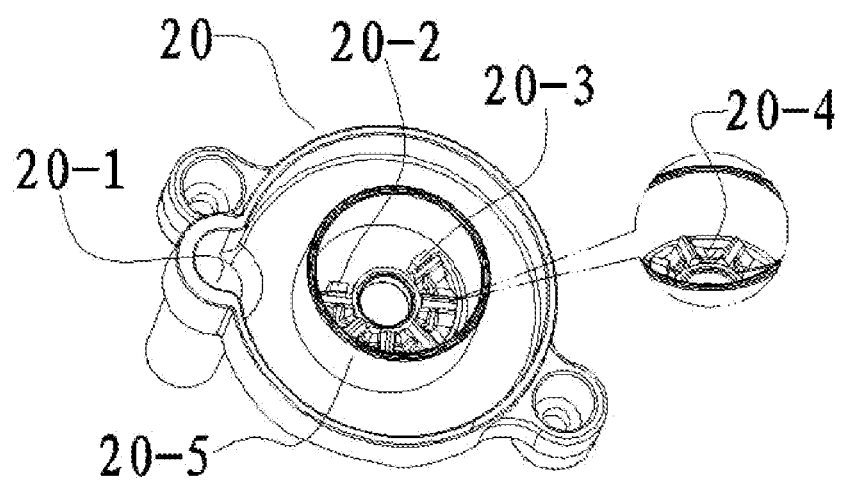
FIG. 14 is a schematic structural analysis diagram of the part 20 in FIG. 13.

As shown in FIG. 13 and FIG. 14, the structural schematic diagram of a second embodiment of the function knob A in this example is shown. The embodiment is derived from the first embodiment. In the second embodiment of the function knob A, a knob transparent aperture bracket 20 and a sealing silica gel ring 21 are added. The sliding post 16 is placed between the knob transparent aperture 13 and the knob transparent aperture bracket 20 and is perpendicular to each other. In this embodiment, the sliding post 16 and potentiometer bolt 13-2 are arranged side by side, as shown in the figure. In the embodiment, the knob transparent aperture bracket 20 is provided with a gear groove 20-4, a limiting bump 20-2 and a limiting bump 20-3, a drainage pipe 20-1 and an annular surrounding bone 20-5. A sealing silica gel ring 21 is provided between the knob transparent aperture bracket 20 and the face shell 2. The drainage pipe 20-1 is directly connected to the bottom cover water leakage port 1-1, and the annular surrounding bone 20-5 is inserted into the surrounding bone 13-3 and overlapped with each other. The function is to prevent the water droplets entering the knob from flowing backwards, and the entered water droplets can only be discharged out of the line base through the drainage pipe. In this embodiment, the knob transparent aperture bracket 20 is a transparent member. In this embodiment, simple modifications or improvements made by those skilled in the art, such as changing the gear groove 20-4 to the knob transparent aperture, changing the sliding post 16 to the knob transparent aperture bracket 20, and exchanging the position, are considered to be within the protection scope of this embodiment.

Figure 15:
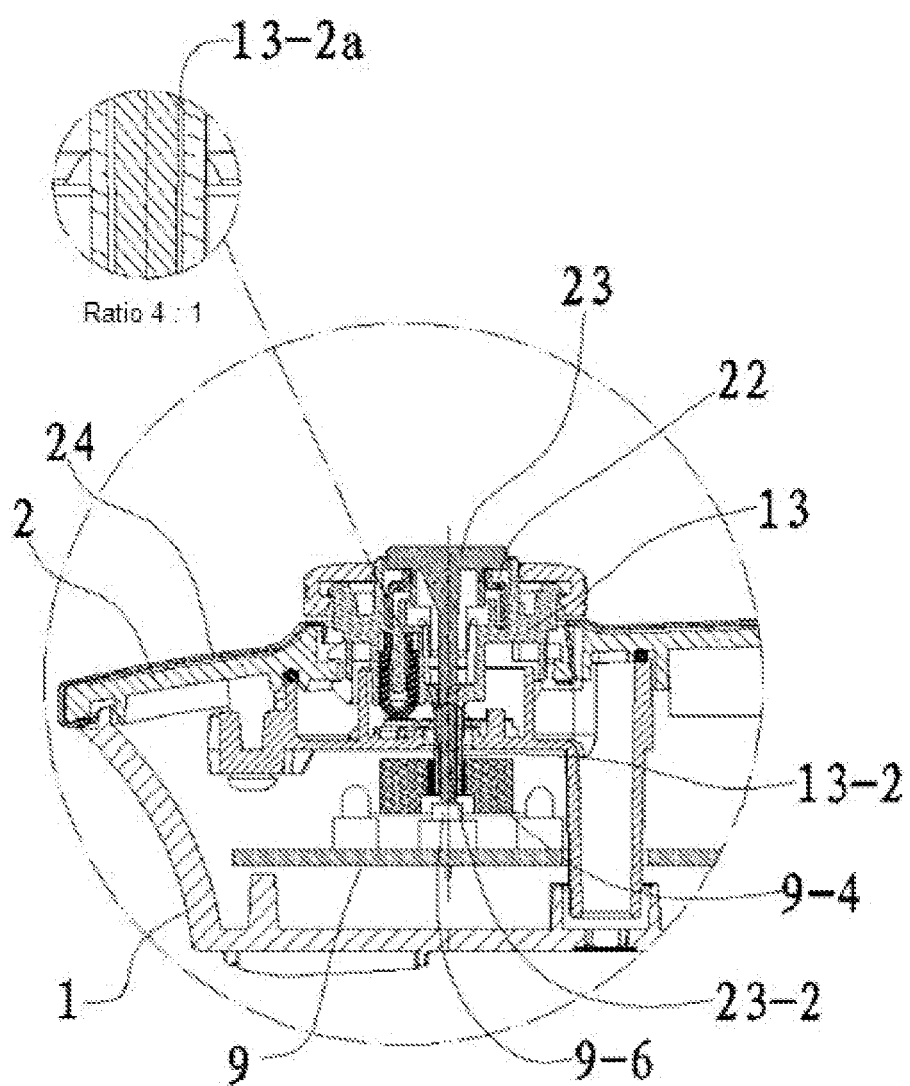
FIG. 15 is a schematic sectional view of a third structural embodiment of a function knob.
Figure 16:
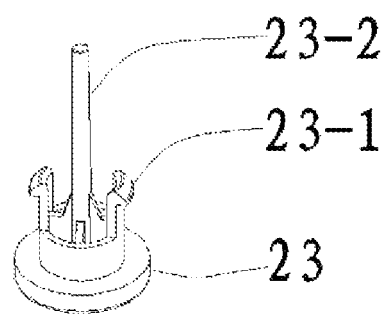
FIG. 16 is a schematic structural analysis diagram of the part 23 in FIG. 15.

As shown in FIG. 15 and FIG. 16, the structural schematic diagram of a third embodiment of the function knob A in this embodiment is shown. The third embodiment mainly explains that the knob decorative sheet is changed into a depressible knob key 23 on the basis of the above function knob. The potentiometer bolt 13-2 on the knob transparent aperture 13 is provided with a through hole 13-2a. The knob key 23 is provided with a key pin 23-2 and a buckle position 23-1. The key pin 23-2 is placed on the key switch 9-6 through the through hole 13-2a. The elastic silica gel 22 is provided between the knob key 23 and the knob transparent aperture 13. The elastic silica gel 22 plays a role in sealing and resetting the key press. In addition, the surface of the face shell 2 is coated with a layer of hardware face shell 24, which can improve the product grade.

Figure 17:
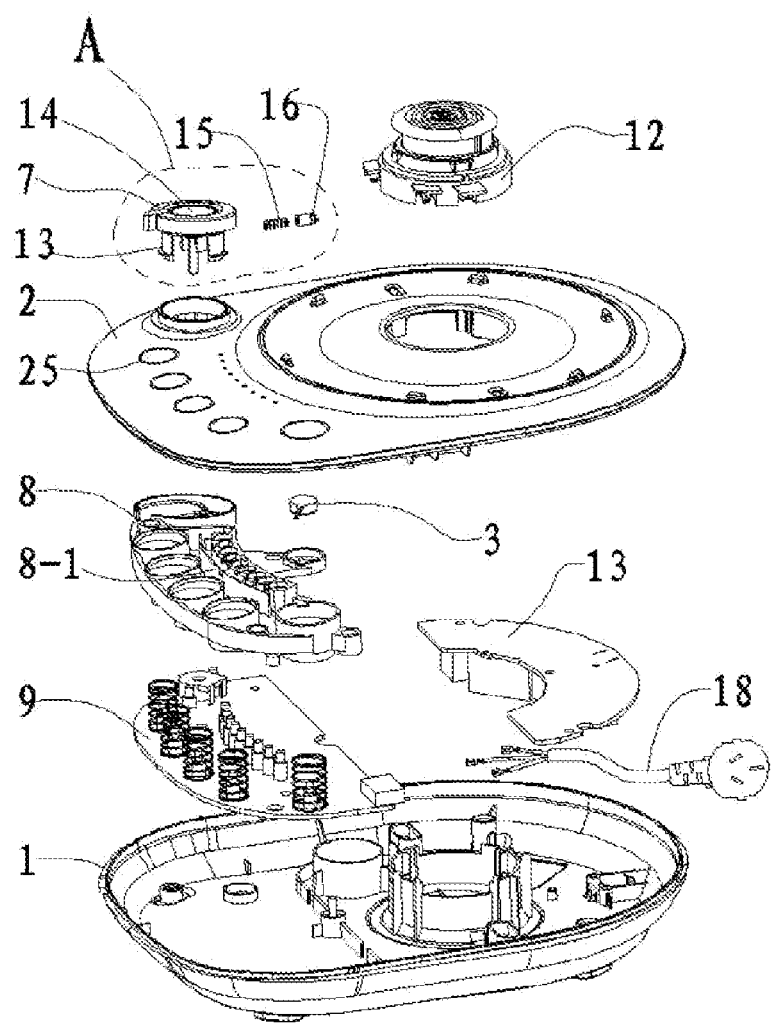
FIG. 17 is a separation schematic diagram of a second preferred embodiment of the present disclosure.
Figure 18:
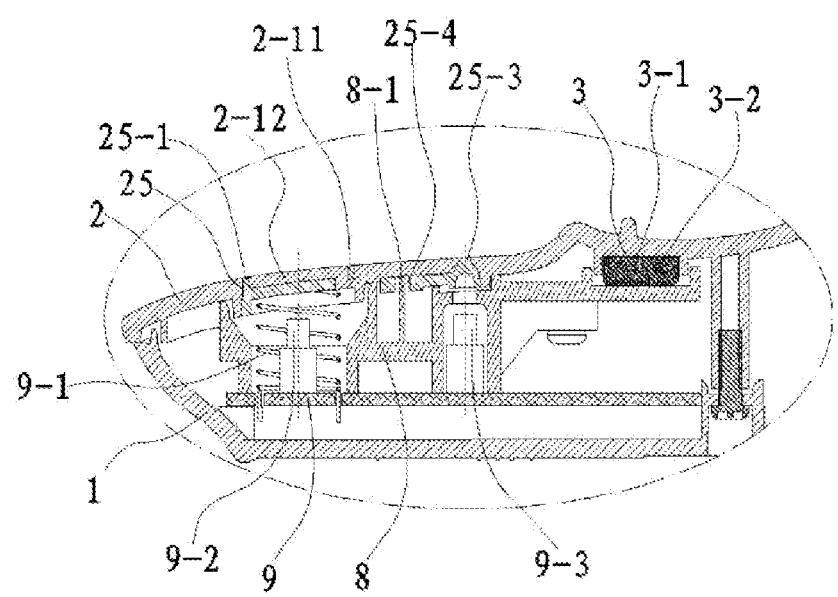
FIG. 18 is a schematic sectional view of a second preferred embodiment of the present disclosure.
Figure 19:
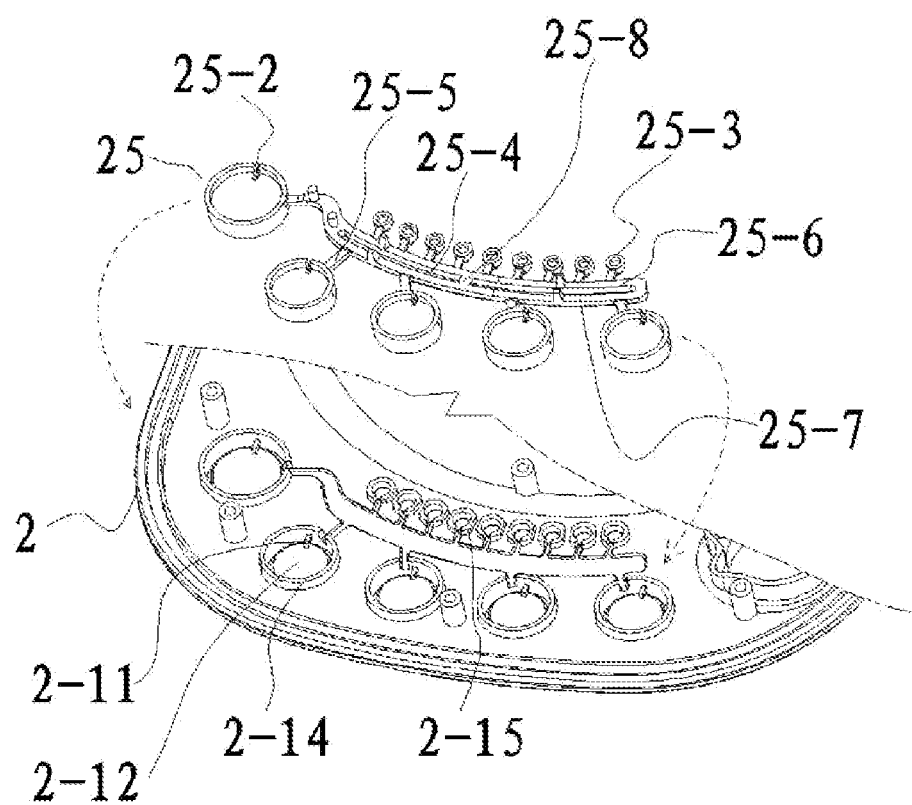
FIG. 19 is a structural separation schematic diagram of a first embodiment in which the part 2 and the part 25 perform mutual secondary injection molding in FIG. 18.

As shown in FIG. 17, it is a separation schematic diagram of parts according to a second embodiment of the present disclosure. As shown in FIG. 18, it is a schematic structural sectional view of a second embodiment. The difference from the first embodiment of FIGS. 1 to 8 is that the touch key transparent aperture and the lamp strip progress bar in the described embodiment are secondary injection molding or two-color injection molding process, while the first sealing ring 6 and the second sealing ring 10 are omitted in this embodiment, the aperture 25 is a primary injection molding part, and the face shell 2 is a secondary injection molding part. As shown in FIG. 19, it is a structural separation schematic diagram of a first embodiment in which the face shell 2 and the transparent aperture 25 perform mutual secondary injection molding in FIG. 18. In the preferred embodiment, the transparent aperture 25 consists of an aperture 25-1, a glue feeding notch 25-2, a plurality of lamp strip progress bars 25-3, a hole groove 25-4, a first connecting arm 25-5, a second connecting arm 25-6 and a third connecting arm 25-7 integrally. This integrated structure is beneficial to the secondary injection molding and positioning of parts. When choosing the two-color injection molding process, it can reduce the number of molds flowing to hot nozzles, so as to reduce the cost of molds. A touch wall 2-12 filled by secondary injection molding is provided in the inner ring of the transparent aperture 25. The touch wall 2-12 is injection molded by dipping glue at the position of the glue feeding notch 25-2. The touch wall 2-12 is integrated with the face shell 2 through the dipping glue arm 2-11. The dipping glue arm 2-11 will have shadows when transmitting light. Therefore, the width of the glue feeding notch 25-2 is recommended to be about 1.0 mm. On the premise of satisfying the secondary injection molding process, the gap width should be as small as possible.

As shown in FIG. 18, in order to avoid light escaping from the lamp source between the transparent aperture 25-1 and the lamp strip progress bar 25-3, the fixing base 8 is provided with a spacer 8-1 inserted into the hole groove 25-4. The face shell 2 is provided with a first surrounding bone 2-14 and a second surrounding bone 2-15. The surrounding bone plays a role of light blocking, and its light blocking structure is similar to the first embodiment, which it will not be described in detail here.

Figure 20:
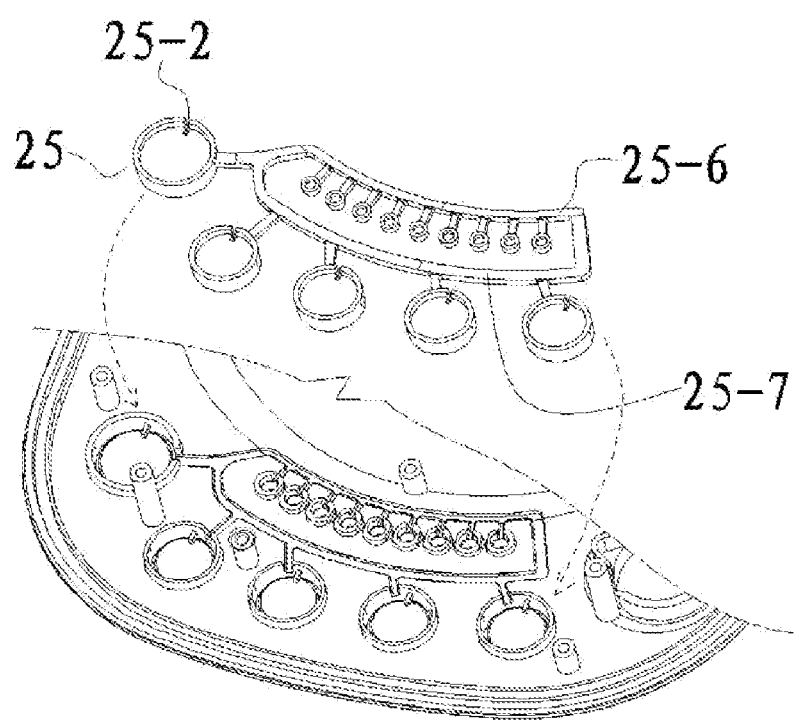
FIG. 20 is a structural separation schematic diagram of a second embodiment in which the part 2 and the part 25 perform mutual secondary injection molding in FIG. 18.

As shown in FIG. 20, it is a structural separation schematic diagram of a second embodiment in which the face shell 2 and the transparent aperture 25 perform mutual secondary injection molding in FIG. 18. The difference from the first embodiment is that the connecting arm 25-6 of the transparent aperture 25 is provided with an external connection, and the distance between the connecting arm 25-6 and the touch key transparent aperture 25-1 is widened, so that the anti-light escaping effect is better than that of the first embodiment of FIG. 19.

Figure 21:
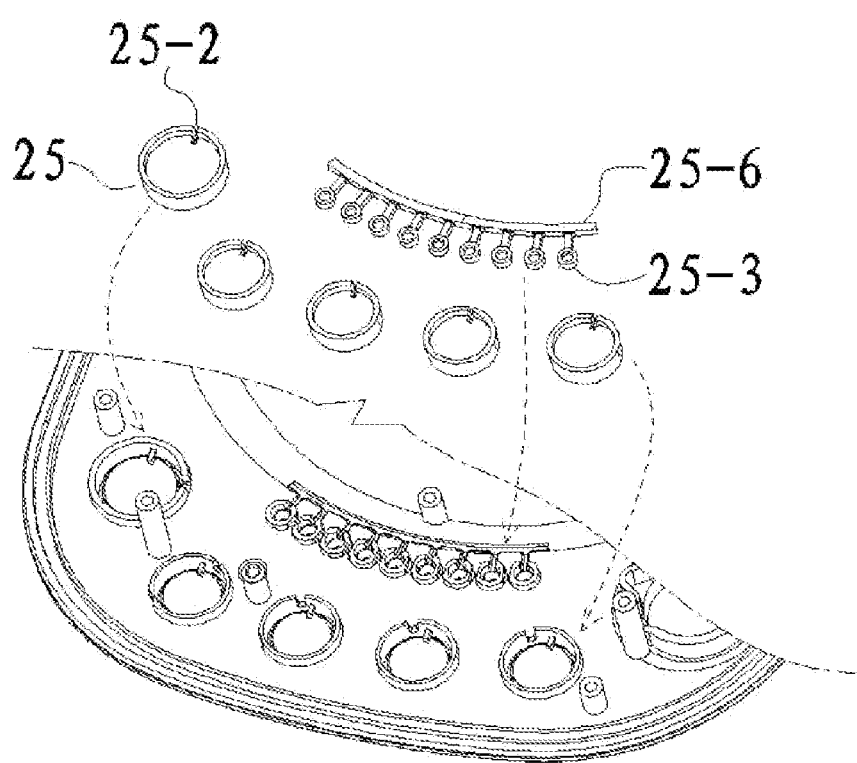
FIG. 21 is a structural separation schematic diagram of a third embodiment in which the part 2 and the part 25 perform mutual secondary injection molding in FIG. 18.

As shown in FIG. 21, it is a structural separation schematic diagram of a third embodiment in which the face shell 2 and the transparent aperture 25 perform mutual secondary injection molding in FIG. 18. The difference from the second embodiment is that the transparent aperture 25 is independently separated, and the anti-light escaping effect is better than that of the first and second embodiments.

The present disclosure has good waterproof, dustproof, LED light guide, and vibrating effects.

What is claimed is:

1. A power supply socket with vibration touch keys, comprising a face shell, a bottom cover, a lower connector, a control circuit board and a power cord, wherein the inner side of the face shell is provided with a vibration motor installing groove, a vibration motor is installed in the vibration motor installing groove, the vibration surface of the vibration motor is in close contact with the bottom plane of the vibration motor installing groove, the vibration motor is electrically connected with the control circuit board, and the vibration motor has synchronous vibration signal feedback when a finger touches a key, wherein:
the face shell is provided with a touch key installing hole, the touch key installing hole is provided with a touch key transparent aperture, a first sealing ring is provided between the touch key transparent aperture and the face shell, a transparent aperture fixing base for fixing the touch key transparent aperture is provided below the touch key transparent aperture, the touch key transparent aperture is located above the transparent aperture fixing base, a fixing base through hole is provided at the middle position of the transparent aperture fixing base corresponding to finger touch, and a touch spring on the control circuit board and an indicator lamp are installed in the middle of the fixing base through hole;
the face shell is provided with a lamp strip installing hole, a lamp strip progress bar is installed at the lamp strip installing hole, the lamp strip progress bar consists of a plurality of lamp strip posts, a second sealing ring is provided between the lamp strip progress bar and the face shell, a lamp strip post fixing base for fixing the lamp strip post is provided below the lamp strip post, a lamp strip post through hole is provided in the middle of the lamp strip post fixing base corresponding to the lamp strip post, and a lamp strip indicator lamp is installed in the lamp strip post through hole.

2. A power supply socket with vibration touch keys, comprising a face shell, a bottom cover, a lower connector, a control circuit board and a power cord, wherein the inner side of the face shell is provided with a vibration motor installing groove, a vibration motor is installed in the vibration motor installing groove, the vibration surface of the vibration motor is in close contact with the bottom plane of the vibration motor installing groove, the vibration motor is electrically connected with the control circuit board, and the vibration motor has synchronous vibration signal feedback when a finger touches a key, wherein a function knob is provided, the function knob comprises a knob, a knob transparent aperture, a knob decorative sheet, a knob spring and a sliding post, the face shell is provided with a function knob installing hole, a function knob gear groove and a function knob limiting block; the center of the function knob is provided with a bolt connected with a potentiometer, when the function knob rotates to switch an angle, the bolt of the potentiometer drives the potentiometer to switch a function angle, and the sliding post stretches and bounces into the corresponding gear groove.

3. A power supply socket with vibration touch keys, comprising a face shell, a bottom cover, a lower connector, a control circuit board and a power cord, wherein the inner side of the face shell is provided with a vibration motor installing groove, a vibration motor is installed in the vibration motor installing groove, the vibration surface of the vibration motor is in close contact with the bottom plane of the vibration motor installing groove, the vibration motor is electrically connected with the control circuit board, and the vibration motor has synchronous vibration signal feedback when a finger touches a key, the vibration surface of the vibration motor is provided with an adhesive layer which closely adheres to the bottom plane of the vibration motor installing groove; the back surface of the vibration motor is pressed by a motor fixing base, and an elastic buffer material layer is provided between the back surface of the vibration motor and the motor fixing base.

4. The power supply socket with vibration touch keys according to claim 2, wherein the touch key transparent aperture comprises an aperture ring, a first polygonal positioning hole, a first positioning rib gap, a limiting bump, a sealing convex rib, the aperture ring is provided with a touch decorative sheet, the touch decorative sheet is provided with a touch decorative sheet positioning post, a first positioning rib and an abutting surface, the touch decorative sheet positioning post abuts against a first polygonal positioning hole of a transparent aperture, and the first positioning rib of the touch decorative sheet is matched with the first positioning rib gap of the transparent aperture; the face shell is provided with a limiting notch, a lamp strip limiting notch, a key silica gel sealing groove and a lamp strip silica gel sealing groove, and the limiting bump of the touch key transparent aperture is matched with the limiting notch of the face shell.

5. The power supply socket with vibration touch keys according to claim 1, wherein the lamp strip progress bar comprises a lamp strip post, a limiting rib, and a connecting arm, and the limiting rib is matched with the lamp strip limiting notch on the face shell.

6. The power supply socket with vibration touch keys according to claim 1, wherein: the face shell is provided with a key transparent aperture surrounding bone and a light bar surrounding bone, the transparent aperture fixing base is provided with a first anti-light escaping surrounding bone, the lamp strip post fixing base is provided with a second anti-light escaping surrounding bone, the touch key transparent aperture is accommodated in the first anti-light escaping surrounding bone, the lamp strip of a lamp strip abutment table is accommodated in the second anti-light escaping surrounding bone, the first anti-light escaping surrounding bone on the transparent aperture fixing base abuts against the key transparent aperture surrounding bone, the second anti-light escaping surrounding bone abuts against the lamp strip surrounding bone, the transparent aperture fixing base is provided with a lamp ring avoiding notch, the lamp strip post fixing base is provided with a lamp strip avoiding notch, and a lamp ring limiting lug corresponding to the lamp strip avoiding notch and a lamp strip limiting rib corresponding to the lamp strip avoiding notch provide assembly retreating.

7. The power supply socket with vibration touch keys according to claim 2, wherein the knob transparent aperture comprises a centering shaft, a potentiometer knob bolt, an elastic buckle, a male buckle, a limiting convex rib and an abutting surface convex rib, the knob is provided with a knob installing hole, a recess and a female buckle, the knob transparent aperture limiting convex rib is matched with the recess, and the male buckle is buckled with the female buckle.

8. The power supply socket with vibration touch keys according to claim 1, wherein the touch key transparent aperture sealing ring, the connecting arm and the connecting arm of the lamp strip progress strip sealing ring are connected integrally.

9. The power supply socket with vibration touch keys according to claim 2, wherein the function knob is provided with an annular convex rib, the abutting mating surface between the knob and the knob transparent aperture is provided with a waterproof sealing rib on the knob transparent aperture.

10. The power supply socket with vibration touch keys according to claim 2, wherein the function knob further comprises a knob transparent aperture bracket and a sealing silica gel ring, the sliding post is provided between the knob transparent aperture and the knob transparent aperture bracket and is perpendicular to each other, the knob transparent aperture bracket is provided with a gear groove, a limiting lug and a limiting lug, a drainage pipe and an annular surrounding bone, a sealing silica gel ring is provided between the knob transparent aperture bracket and the face shell, the drainage pipe is directly connected to the bottom cover water leakage port, and the annular surrounding bone is inserted into the surrounding bone and overlapped with each other.

11. The power supply socket with vibration touch keys according to claim 2, wherein the knob decorative sheet is a depressible knob key, the potentiometer bolt on the knob transparent aperture is provided with a through hole, the knob key is provided with a key pin and a buckle position, the key pin is placed on the key switch through the through hole, the elastic silica gel is provided between the knob key and the knob transparent aperture, and the elastic silica gel plays a role in sealing and resetting the key press.

* * * * *